US012467129B2

(12) United States Patent
Ward et al.

(10) Patent No.: US 12,467,129 B2
(45) Date of Patent: Nov. 11, 2025

(54) SPUTTERING APPARATUS AND RELATED SYSTEMS AND METHODS FOR SPUTTERING SUBSTRATES

(71) Applicant: BATTELLE SAVANNAH RIVER ALLIANCE, LLC, Aiken, SC (US)

(72) Inventors: Patrick A. Ward, Aiken, SC (US); Zachary Duca, Augusta, GA (US); John T. Bobbitt, III, Evans, GA (US)

(73) Assignee: Battelle Savannah River Alliance, LLC, Aiken, SC (US)

(*) Notice: Subject to any disclaimer, the term of this patent is extended or adjusted under 35 U.S.C. 154(b) by 117 days.

(21) Appl. No.: 17/983,454

(22) Filed: Nov. 9, 2022

(65) Prior Publication Data

US 2024/0150886 A1 May 9, 2024

(51) Int. Cl.

| | |
|---|---|
| ***C23C 14/50*** | (2006.01) |
| ***H01J 37/32*** | (2006.01) |
| ***H01J 37/34*** | (2006.01) |

(52) U.S. Cl.

CPC ...... *C23C 14/505* (2013.01); *H01J 37/32779* (2013.01); *H01J 37/3411* (2013.01)

(58) Field of Classification Search

CPC ............... C23C 14/505; C23C 14/3407; H01J 37/32779; H01J 37/3411; B60S 9/04; B60S 9/06; B60S 9/18

USPC .................................................. 254/424, 425

See application file for complete search history.

(56) References Cited

U.S. PATENT DOCUMENTS

| | | | | |
|---|---|---|---|---|
| 4,417,968 A * | 11/1983 | McKelvey .......... | H01J 37/3405 204/192.12 |
| 5,135,554 A | 8/1992 | Rogers, Jr. et al. | |
| 5,618,388 A * | 4/1997 | Seeser ................... | C23C 14/568 204/192.12 |
| 5,795,448 A * | 8/1998 | Hurwitt ................. | C23C 14/505 204/192.12 |
| 5,914,154 A | 6/1999 | Nemser | |
| 6,113,752 A | 9/2000 | Hollstein | |

(Continued)

FOREIGN PATENT DOCUMENTS

| | | |
|---|---|---|
| DE | 4402471 C2 | 8/1995 |
| EP | 0526702 B1 | 2/1993 |

(Continued)

*Primary Examiner* — Michael A Band

(74) *Attorney, Agent, or Firm* — Dority & Manning, P.A.

(57) ABSTRACT

A sputtering apparatus includes a substrate holder assembly configured to support a plurality of elongated substrates relative to a sputtering source. Each elongated substrate of the plurality of elongated substrates extends along a respective substrate axis. The sputtering apparatus also includes a holder drive assembly that is configured to rotate the substrate holder assembly about a holder axis. Each respective substrate axis is oriented non-parallel relative to the holder axis. Further, the sputtering apparatus includes a substrate drive assembly that is configured to individually rotate each elongated substrate about its respective substrate axis. The sputtered material is configured to be deposited onto the plurality of elongated substrates as the substrate holder assembly is being rotated about the holder rotational axis simultaneous with the rotation of each elongated substrate about its respective substrate axis.

3 Claims, 6 Drawing Sheets

(56) References Cited

U.S. PATENT DOCUMENTS

| | | | | |
|---|---|---|---|---|
| 6,494,997 | B1 * | 12/2002 | Israel | C23C 14/352 204/192.12 |
| 6,620,300 | B2 | 9/2003 | Singh et al. | |
| 7,520,965 | B2 | 4/2009 | Wei | |
| 7,985,296 | B2 * | 7/2011 | Chen | C23C 16/458 118/503 |
| 10,597,782 | B2 | 3/2020 | Buet et al. | |
| 2002/0062791 | A1 * | 5/2002 | Ginovker | C23C 14/505 118/728 |
| 2007/0099527 | A1 | 5/2007 | Brun et al. | |
| 2011/0171399 | A1 | 7/2011 | Brun et al. | |

FOREIGN PATENT DOCUMENTS

| | | | |
|---|---|---|---|
| FR | 3044022 | B1 | 5/2017 |
| GB | 2243844 | A | 11/1991 |
| JP | S 6296672 | A | 5/1987 |
| JP | H 08239246 | A | 9/1996 |

* cited by examiner

SPUTTERING APPARATUS AND RELATED SYSTEMS AND METHODS FOR SPUTTERING SUBSTRATES

FEDERAL RESEARCH STATEMENT

This invention was made with government support under Contract No. 89303321CEM000080 awarded by the U.S. Department of Energy. The government has certain rights in the invention.

FIELD OF THE INVENTION

The present subject matter relates generally to the sputtering of substrates and, more particularly, to a sputtering apparatus and related systems and methods for sputtering substrates.

BACKGROUND OF THE INVENTION

The manufacturing process of sputtering is a widely used process across many industries including semiconductor processing, precision optics, and surface finishing. Sputtering is a process of applying a thin-film to an object for various benefits. During the sputtering process it is advantageous to attain a uniform and high-quality film over the object. Additionally, it is often advantageous to be able to deposit the thin-film on multiple objects simultaneously.

In this regard, there is a need for improved systems and methods for sputtering objects uniformly and simultaneously.

BRIEF DESCRIPTION OF THE INVENTION

Aspects and advantages of the invention will be set forth in part in the following description, or may be apparent from the description, or may be learned through practice of the invention.

In one example embodiment, a sputtering system includes a sputtering source, and a sputtering apparatus. The sputtering apparatus includes a substrate holder assembly configured to support a plurality of elongated substrates relative to the sputtering source. Each elongated substrate of the plurality of elongated substrates extends along a respective substrate axis. The sputtering apparatus also includes a holder drive assembly that is configured to rotate the substrate holder assembly about a holder axis. Each respective substrate axis is oriented non-parallel relative to the holder axis. Further, the sputtering apparatus includes a substrate drive assembly that is configured to individually rotate each elongated substrate about its respective substrate axis. The sputtered material is configured to be deposited onto the plurality of elongated substrates as the substrate holder assembly is being rotated about the holder rotational axis simultaneous with the rotation of each elongated substrate about its respective substrate axis.

In another example embodiment, a sputtering system includes a sputtering source, and a sputtering apparatus. The sputtering apparatus includes a substrate holder assembly configured to support a plurality of elongated substrates relative to the sputtering source. Each elongated substrate of the plurality of elongated substrates extends along a respective substrate axis. The sputtering apparatus also includes a holder drive assembly that is configured to rotate the substrate holder assembly about a holder axis. Further, the sputtering apparatus includes a substrate transmission that is operatively coupled between a drive source and the plurality of elongated substrates such that the substate transmission is configured to individually rotate each elongated substrate about its respective substrate axis. The sputtered material is configured to be deposited onto the plurality of elongated substrates as the substrate holder assembly is being rotated about the holder rotational axis simultaneous with rotation of each elongated substrate about its respective substrate axis.

In another example embodiment, a method of sputtering substrates supported by a sputtering apparatus. The sputtering apparatus includes a substrate holder assembly configured to support a plurality of elongated substrates. Each elongated substrate of the plurality of elongated substrates extends along a respective substrate axis. The method includes rotationally driving the substrate holder assembly such that the substrate holder rotates about a holder axis. Then, individually rotating each elongated substrate of the plurality of elongated substrates about its respective substrate axis. Each respective substrate axis is oriented non-parallel relative to the holder axis. The method also including depositing, from a sputtering source, sputtered material onto the plurality of elongated substrates as the substrate holder assembly is rotating about the holder axis simultaneous with rotation of each elongated substrate about its respective substrate axis.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
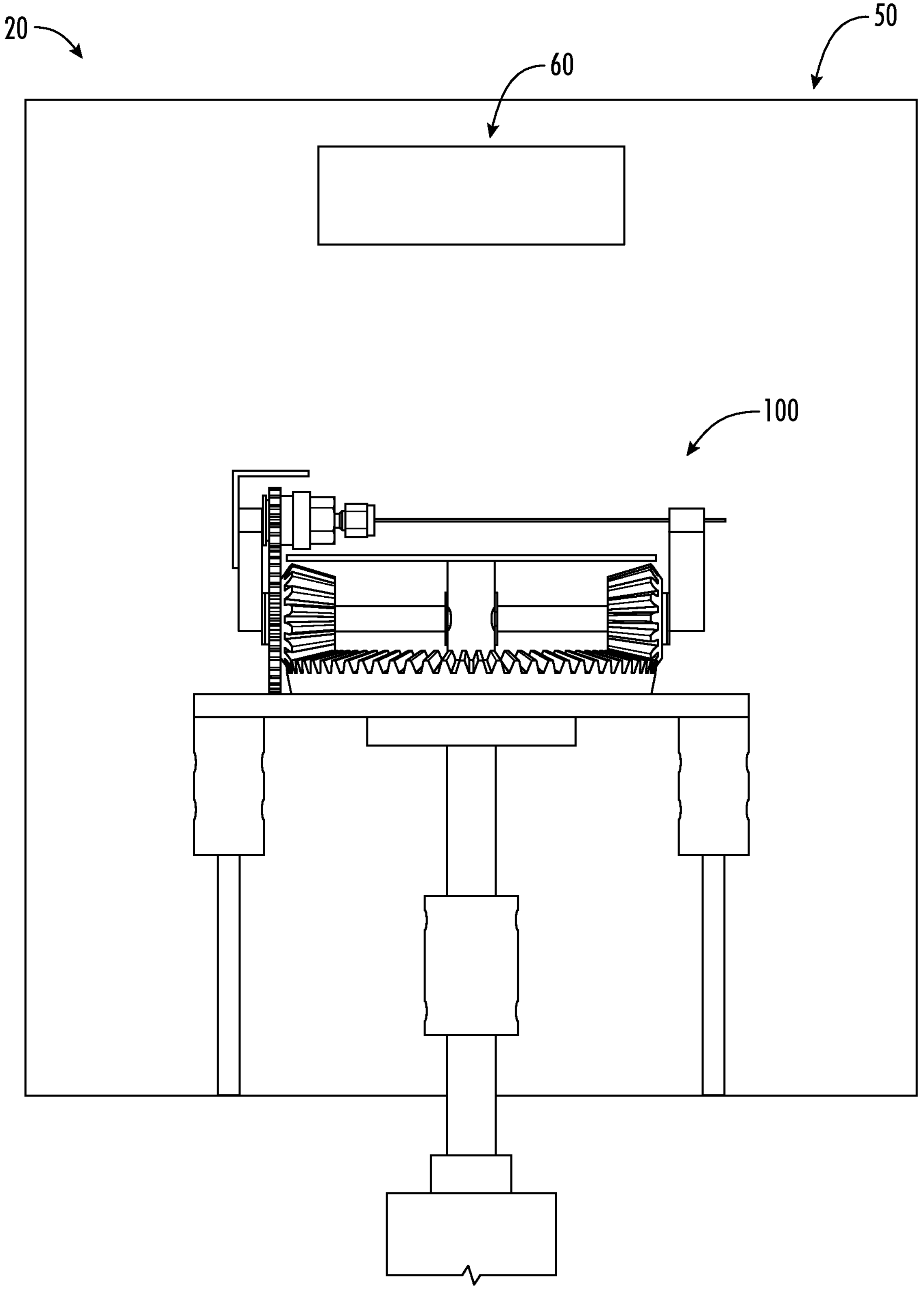
FIG. 1 illustrates a schematic side view of one embodiment of a sputtering system for performing a sputtering operation in accordance with aspects of the present subject matter.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to a sputtering apparatus and related systems and methods for sputtering substrates. Specifically, the present subject matter is directed to a sputtering apparatus configured for use in a controlled environment of a sputtering system (e.g., within an associated sputtering chamber of the system). The sputtering apparatus may include a substrate holder assembly configured to support a plurality of elongated substrates. As will be described below, the apparatus may also include a holder drive assembly and a substrate drive assembly, with the holder drive assembly being configured to rotate the holder assembly about a holder axis simultaneous with the substrate drive assembly being used to rotate each substrate about a respective substrate axis separate from the holder axis. For instance, in one embodiment, each substrate axis may be oriented non-parallel relative to the holder axis, such as by being oriented perpendicular to the holder axis. The simultaneous, dual-rotation arrangement of the sputtering apparatus may permit a smooth and even coating, e.g., a thin film, of sputtered material to be deposited from a sputtering source onto the substrates.

Figure 2:
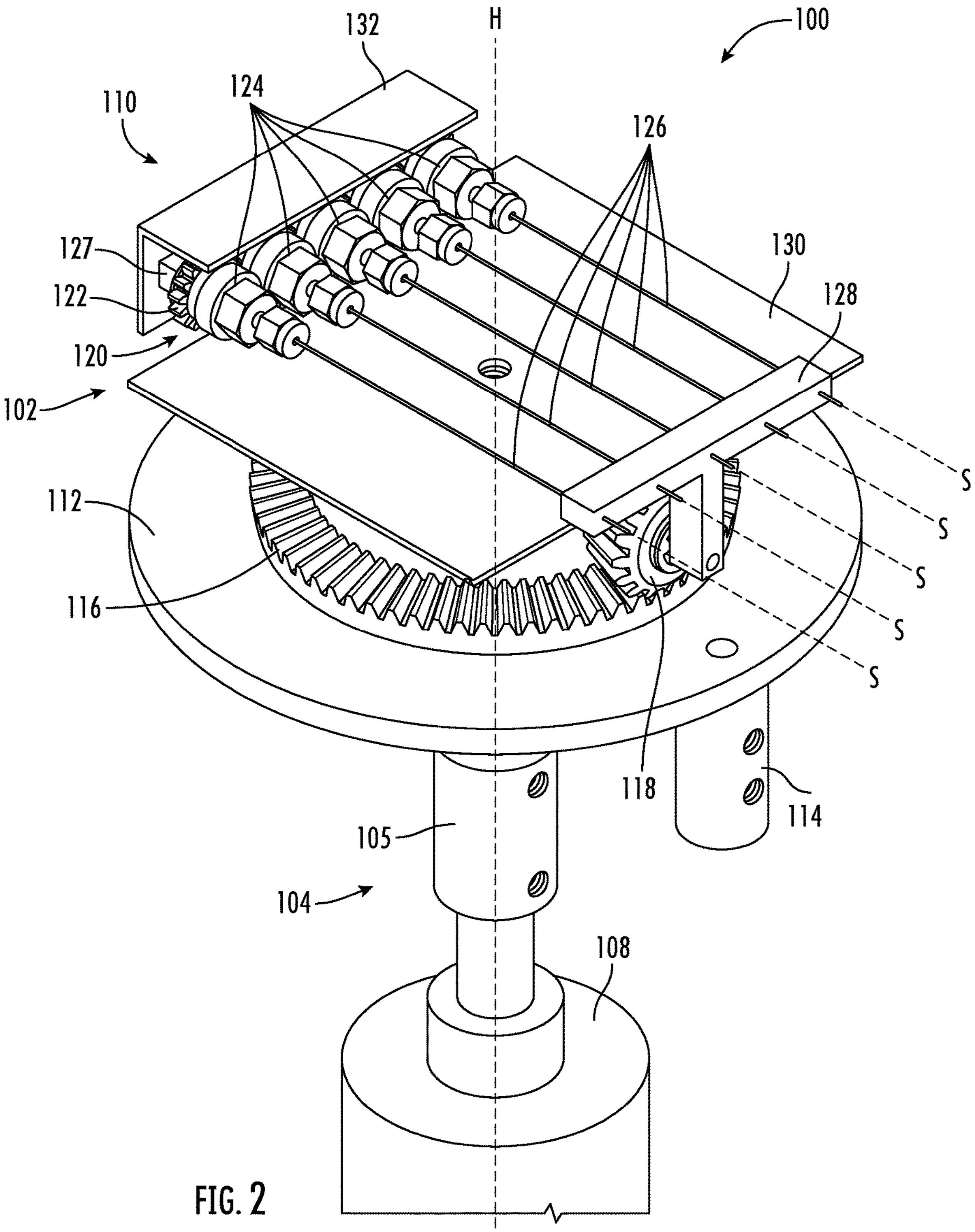
FIG. 2 illustrates a perspective view of one embodiment of a sputtering apparatus in accordance with aspects of the present subject matter.
Figure 3:
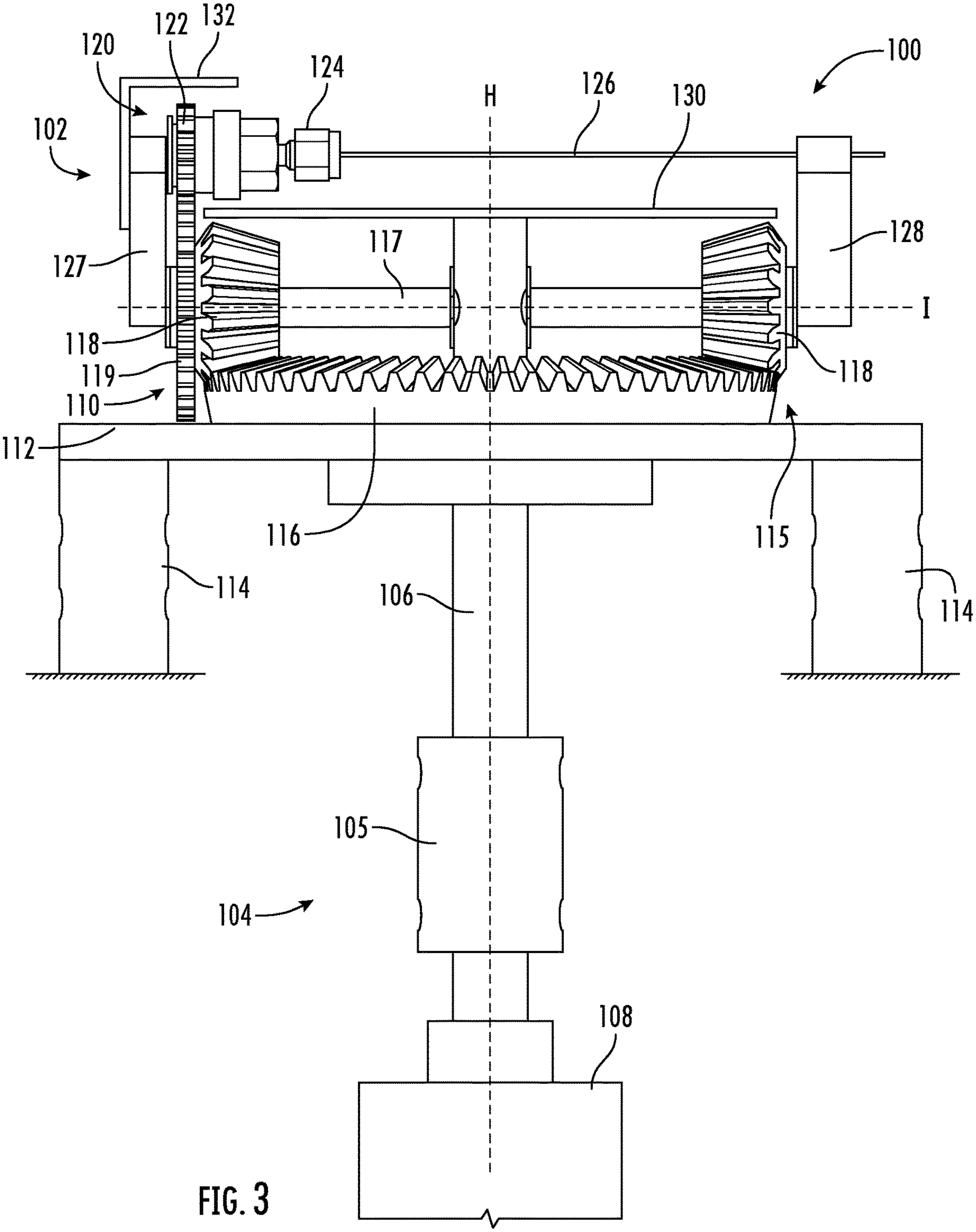
FIG. 3 illustrates a side view of the sputtering apparatus of FIG. 2.
Figure 4:
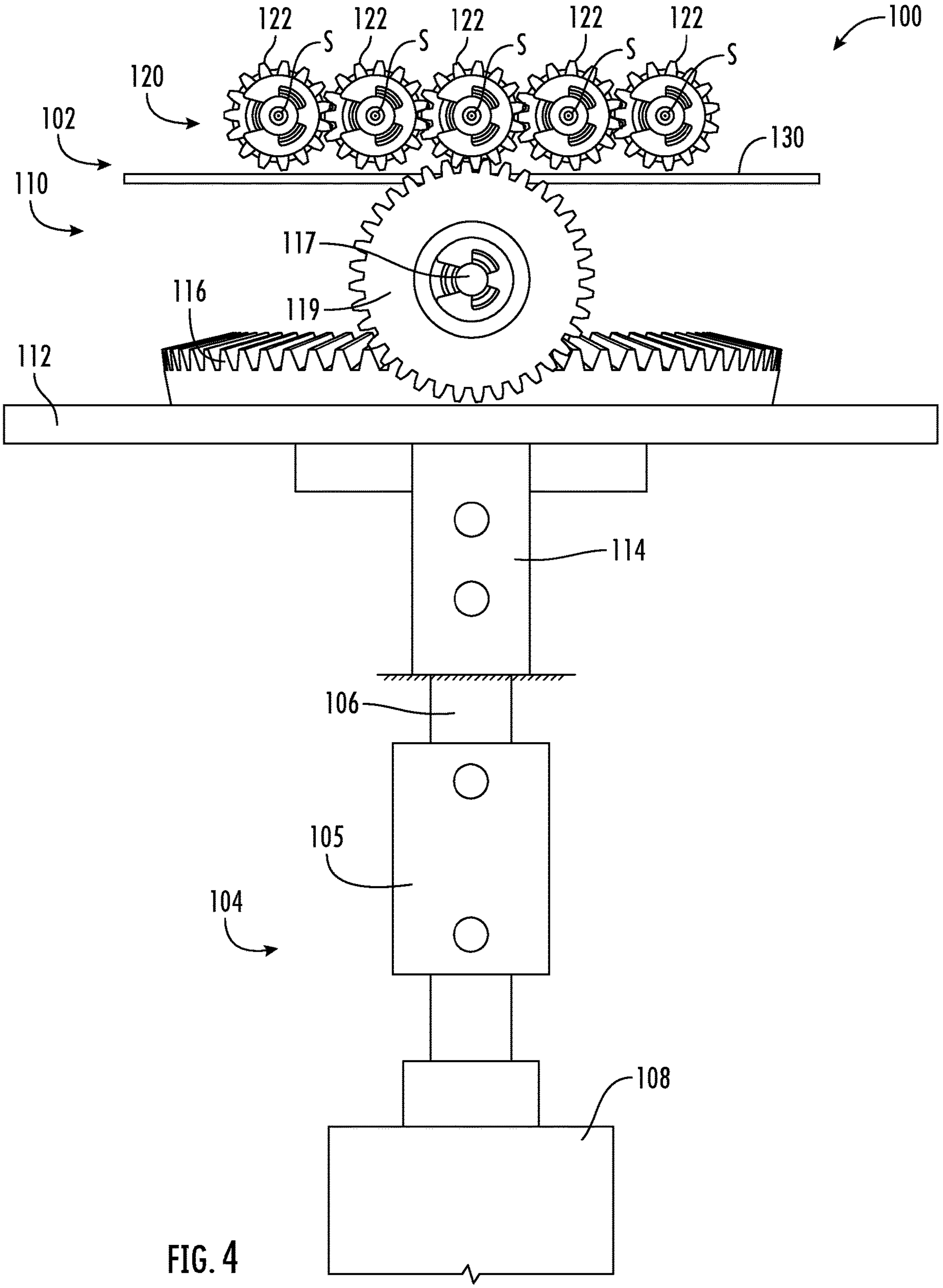
FIG. 4 illustrates a side view of a substrate transmission of the sputtering apparatus of FIG. 2 in accordance with aspects of the present subject matter.

Referring now to FIGS. 1-4, several views of one embodiment of a sputtering system 20 and an associated sputtering apparatus 100 for allowing substrates to be rotated about separate axes simultaneously during the performance of a sputtering operation are illustrated in accordance with aspects of the present subject matter. Specifically, FIG. 1 illustrates a schematic, side view of one example embodiment of a sputtering system 20 for performing a sputtering operation using the disclosed sputtering apparatus 100 in accordance with aspects of the present subject matter. FIG. 2 illustrates an isometric perspective view of the sputtering apparatus 100 shown in FIG. 1 and FIG. 3 illustrates a side, elevation view of the sputtering apparatus 100 of FIG. 2. Additionally, FIG. 4 illustrates a side, section view of several of the apparatus components shown in FIGS. 2 and 3.

In general, as shown in FIG. 1, a sputtering operation may be performed in a controlled environment, such as a sputtering chamber 50. A sputtering source 60 and the sputtering apparatus 100 may be positioned in the sputtering chamber 50. In some example embodiments, sputtering source 60 may be a pure metal, an alloy, or a ceramic sputtering source. The process of sputtering may, in one embodiment, include bombarding the sputtering source 60 with high energy particles in order to deposit a thin film on the object(s) or substrate(s) being sputtered. For example, sputtering apparatus 100 may be generally configured to hold a plurality of substrates for sputtering. In particular, as will be described in greater detail below, sputtering apparatus 100 may be configured to simultaneously rotate elongated substrates, e.g., wires or fibers, about separate axes during the performance of a sputtering operation within the controlled environment, e.g., sputtering chamber 50.

Referring specifically to FIGS. 2 and 3, sputtering apparatus 100 may include a substrate holder assembly 102 configured to support a plurality of elongated substrates 126 (e.g., fibers, wires, etc.) onto which sputtered material is to be deposited. In addition, the sputtering apparatus 100 includes a holder drive assembly 104 and a substrate drive assembly 110. As will be described below, the holder drive assembly 104 may be configured to rotate the substrate holder assembly 102 (and the substrates 126 supported thereby) about a holder axis (e.g., axis H), while the substrate drive assembly 110 simultaneously rotates each supported substrate 126 about a respective substrate axis (e.g., respective axes S) that is oriented non-parallel relative to the holder axis H. For instance, in one embodiment, the various substrate axes S may be oriented perpendicular to the holder axis H, such as by configuring the substrate axes S to be oriented substantially horizontally and by configuring the holder axis H to be oriented substantially vertically.

In general, the substrate holder assembly 102 may include any suitable combination of components for supporting the substrates 126 for rotation about the common holder axis H and each respective substrate axis S. For instance, as shown in FIGS. 2 and 3, the substrate holder assembly 102 may, in several embodiments, include a plurality of drive end holders 124 configured to vertically support "drive ends" of the substrates 126 relative to the remainder of the apparatus 100 and an idle end holder 128 configured to support the "idle ends" of the substrates 126 relative to the remainder of the apparatus 100. In such embodiments, the "drive ends" of the substrates 126 may corresponds to the axial ends of the substrates 126 coupled to a rotational drive source (i.e., the substrate drive assembly 110) for rotating the substrates 126 about their respective substrate axes S, while the idle ends of the substrates 126 may correspond to the opposed axial ends of the substrates 126. In the illustrated embodiment, each drive end holder 124 corresponds to a collet configured to be secured or coupled to a respective drive end of one of the substrates 126. Additionally, substrates 126 may define any suitable cross-sectional shape. As such, drive end holder 124 may be configured to be secured or coupled to the respective drive end of one of the substrates 126 of any suitable cross-sectional shape. As will be described below, the drive end holders 124 may be coupled to corresponding component(s) of the substrate drive assembly 110 such that, when driven by the drive assembly 110, the drive end holders 124 rotate with the substrates 126 about the substrate axes S. In contrast, the idle end holder 128 may, in one embodiment, be fixed with respect to the substrate axes S such that the idle end holder 128 supports the substrates 126 for rotation about the substrate axes S relative to the holder 128. For instance, in the illustrated embodiment, the idle end holder 128 corresponds to a support bracket defining a plurality of apertures or through-holes through which the idle ends of the substrates 126 are received. As such, with the drive ends of the substrates 126 being rotationally driven by the substrate drive assembly 110, the idle ends of the substrates 126 may rotate relative to the idle end holder 128 about their respective axes S.

As indicated above, holder drive assembly 104 may be generally configured to rotate the substrate holder assembly 102 (and the substrates 126 supported thereby) about axis H. In this regard, the holder drive assembly 104 may include any suitable combination of components that facilitates rotating the substrate holder assembly 102 (and the substrates 126 supported thereby) about the axis H. For instance, in the illustrated embodiment, the holder drive assembly 104 includes a driveshaft 106 (FIGS. 3 and 4) configured to be coupled to a drive source 108 via a drive coupler 105. In one embodiment, the drive source 108 may be a motor, e.g., a brushless DC motor, or any other suitable rotational drive source configured to provide rotational motion. The drive source 108 may be generally configured to rotate the driveshaft 106 about axis H, which, in turn, causes rotation of an intermediate shaft 117 coupled thereto about axis H. As will be described below, the intermediate shaft 117 may be coupled at one end to the idle end holder 128 and at an opposed end to a drive end support bracket 127 of the substrate holder assembly 102 that supports the drive end holders 124 for rotation about the substrate axes S. As such, by rotationally driving the drive shaft 106 and the intermediate shaft 117 about axis H, the substrate holder assembly 102 (and the substrates 126 supported thereby) may similarly rotate about axis H.

Referring particularly to FIGS. 2-4, as indicated above, the substrate drive assembly 110 of the sputtering apparatus 100 may be generally configured to separately rotate each elongated substrate 126 about a respective substrate axis S simultaneous with the substrates 126 being rotated about the holder axis H, with such simultaneous rotation about the separate axes S, H allowing an even, thin film of sputtered material to be deposited onto substrates 126 from sputtering source 60. In this regard, substrate drive assembly 110 may generally include any suitable transmission(s) or other suitable drive system component(s) that facilitates separately rotating each elongated substrate 126 about its respective substrate axis S. For example, in the illustrated embodiment, the substrate drive assembly 110 is configured as a gear-based transmission(s) including a geartrain or assembly of gears for transmitting rotational motion from the holder drive assembly 104 to the substrate drive assembly 110 for rotationally driving the substrates 126. For instance, as will be described below, the substrate drive assembly 110 may, in several embodiments, include an upstream or first substrate transmission 115 (e.g., including a fixed ring gear 116, a pair of intermediate gears 118, and a transfer gear 119) provided in operative association with the holder drive assembly 104, and a downstream or second substrate transmission 120 (e.g., including a plurality of substrate gears 122) coupled to the first substrate transmission 115.

As particularly shown in FIGS. 2 and 3, ring gear 116 of substrate drive assembly 110 is coupled to and supported by a fixed platform 112 of sputtering apparatus 100. For instance, as shown in the illustrated embodiment, platform 112 is configured as a ring-shaped support component defining a central opening (not shown) through which the driveshaft 106 extends along axis H. In such an embodiment, ring gear 116 may be positioned on top of the platform 112 so as to be centered about axis H. Additionally, one or more support members 114 may be configured to extend downwardly from the platform 112 and engage/contact associated components/surfaces of the sputtering chamber 50, thereby supporting the platform 112 (and the various components supported relative thereto) within the associated sputtering chamber 50. For instance, the support members 114 may be fixed or secured to corresponding surfaces/components of the sputtering chamber 50.

As particularly shown in FIG. 3, driveshaft 106 may generally be configured to extend through the platform 112 and ring gear 116 along the holder axis H such that a top portion of the shaft 106 is positioned above the ring gear 116. In such an embodiment, the intermediate shaft 117 may be configured to be coupled to the top portion of the driveshaft 106 such that the intermediate shaft 117 extends perpendicular to the driveshaft 106 (and axis H) across the top side of the platform 112 and ring gear 116. For instance, in one embodiment, the intermediate shaft 117 may be inserted through an opening defined through the top portion of the driveshaft 106 to rotationally couple such components together. Additionally, as shown in FIG. 3, the intermediate gears 118 of the substrate drive assembly 110 may be rotationally supported on portions of the intermediate shaft 117 such that the gears 118 rotationally engage or otherwise mesh with the fixed ring gear 116 as the intermediate shaft 117 is rotated with the driveshaft 106 about the central holder axis H. As a result of such engagement with the ring gear 116, the intermediate gears 118 may be configured to rotate relative to the intermediate shaft 117 about an intermediate axis I extending coaxially with the central axis of the shaft 117. As shown in FIG. 3, transfer gear 119 of the substrate drive assembly 110 is rotationally fixed to one of the intermediate gears 118 (i.e., the intermediate gear 118 located adjacent the substrate transmission 120 and drive ends of the substrates 126) for rotation therewith about the axis I. Thus, rotation of the intermediate gears 118 about the axis I results in corresponding rotation of the transfer gear 119, which, in turn, is configured to rotationally drive the downstream substrate transmission 120 for rotating the substrates 126 about their respective substrate axes S. It should be appreciated that, as an alternative to configuring the transfer gear 119 as a separate gear that is fixed to the adjacent intermediate gear 118, such gears may be formed as a single unitary gear (e.g., a step gear).

As particularly shown in FIGS. 3 and 4, the downstream substrate transmission 120 of the substrate drive assembly 110 generally includes a plurality of meshing substrate gears 122, with each substrate gear 122 being coupled to a respective drive end holder 124 of the substrate holder assembly 102. For instance, in the illustrated embodiment, the substrate transmission 120 includes five substrate gears 122 configured to be respectively coupled to corresponding drive end holders 124, thereby allowing the sputtering apparatus 100 to support five separate substrates 126 for sputtering. However, in other embodiments, the sputtering apparatus 100 may include any other suitable number gear/holder pairs configured to support a corresponding number of substrates 126.

As shown in FIG. 4, the transfer gear 119 of the substrate drive assembly 110 is configured to rotationally engage or mesh with one of the substrate gears 122, thereby allowing the transfer gear 119 to rotationally drive the substrate transmission 120. Specifically, in the illustrated embodiment, the transfer gear 119 is configured to mesh with the centrally positioned substrate gear 122. As a result, rotation of the transfer gear 119 will rotationally drive the central substrate gear 122, which, in turn, causes the remaining substrate gears 122 to rotate. Accordingly, since each drive end holder 124 is coupled to its respective substrate gear 122 for rotation therewith (and each drive end holder 124 is secured to the "drive end" of a respective substrate 126), such rotation of the substrate gears 122 results in each substrate 126 being rotated about its respective substrate axis S.

It should be appreciated that the substrate transmission 120 (including the various substrate gears 122) and associated drive end holders 124 of the sputtering apparatus 120 may be supported relative to the remainder of the apparatus 100 via the support bracket 127 coupled to the adjacent end of the intermediate shaft 117. For instance, the support bracket 127 may extend upwardly from the adjacent end of the intermediate shaft 117 and may be coupled to the various substrate gears 122 via a rotational connection (e.g., via shafts/pins and bearings) to allow the substrate gears 122 and drive end holders 124 to rotate relative to the support bracket 127 about the substrate axes S while allowing all of such components to rotate together about the holder axis H. As indicated above, the idle end holder 128 may be coupled to the end of the intermediate shaft 117 opposite the end to which the support bracket 127 is coupled. As a result, with each substrate 126 fixed or coupled at its drive end to a respective drive end holder 124 and the opposed idle end of each substrate 126 being supported by the idle end holder 128, the opposed bracket/holder 127, 128 (along with the gear/holder pairs 122, 124) may generally support the substrates 126 for rotation about the holder axis H while the substrate drive assembly 110 functions to separately rotate the substrates 126 about their respective substrate axes S.

It should be appreciated that, in order to prevent sputtering material from accumulating on certain components of sputtering apparatus 100, the apparatus 100 may include one or more shielding plates. For example, to shield the various components of the substrate drive assembly 110 and/or holder drive assembly 102 from sputtered material, first and second shield plates 130, 132 may be positioned on sputtering apparatus 100. For example, first shield plate 130 may be positioned atop driveshaft 106 such that the ring gear 116, intermediate shaft 117, intermediate gear 118, and transfer gear 119 are shielded from sputtered material. Similarly, second shield plate 132 may be positioned at support bracket 127 such that the substrate gears 122 are shielded from sputtered material.

While the current example embodiment includes the substrate transmission 120 as well as transfer gear 119 configured at one end of intermediate shaft 117, it should be appreciated that in additional or alternative embodiments the substrate transmission 120 as well as transfer gear 119 may be replicated on the opposite end of the intermediate shaft 117. For example, substrates 126 may be supported at both ends by drive end holders 124, driven by substrate gears 122, via transfer gear 119, in unison with respect to both ends of intermediate shaft 117. As such, substrates 126 may be kept in tension, e.g., when substrate 126 are non-rigid structures.

Figure 5:
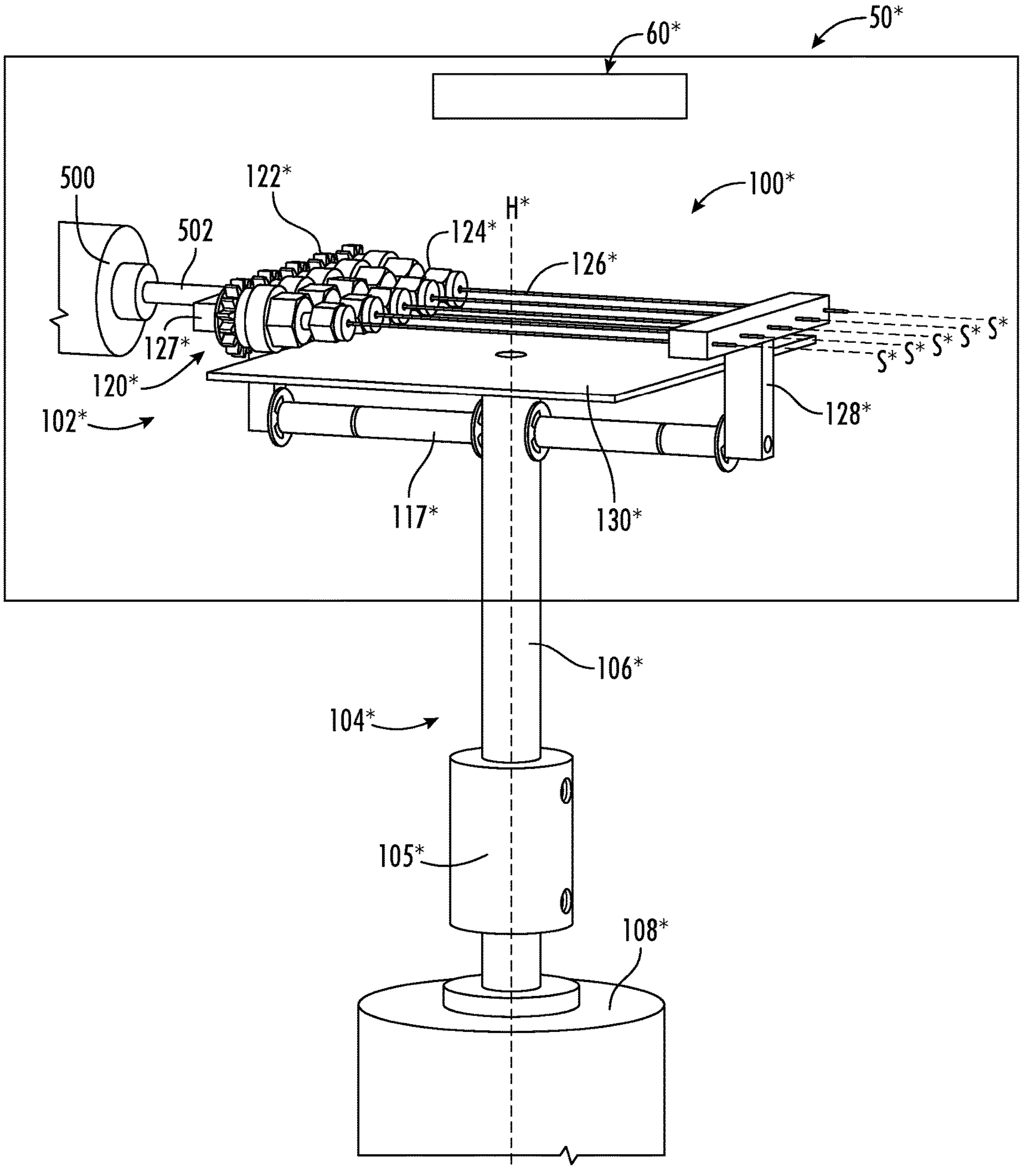
FIG. 5 illustrates a perspective view of another embodiment of a sputtering apparatus in accordance with aspects of the present subject matter.

Referring now to FIG. 5, another embodiment of a sputtering system 20* and associated sputtering apparatus 100* for simultaneously rotating substrates about multiple axes during a sputtering process is illustrated in accordance with aspects of the present disclosure. In general, the system 20* and sputtering apparatus 100* shown in FIG. 5 (and their associated components, features, and/or structures) are configured similar to the system 20 and sputtering apparatus 100 (and their associated components, features, and/or structures) described above with reference to FIGS. 1-4. As such, the components, features, and/or structures of the system 20* and sputtering apparatus 100* that are the same or similar to corresponding components, features, and/or structures of the system 20 and sputtering apparatus 100 described above will be designated by the same reference character with an asterisk (*) added. Additionally, when a given component, feature, and/or structure of the system 20* and/or sputtering apparatus 100* is configured to generally perform the same function as the corresponding component, feature, and/or structure of the system 20 and/or sputtering apparatus 100 described above, a less detailed description of such component/feature/structure will be provided below for the sake of brevity.

As shown in FIG. 5, similar to the embodiment described above, the sputtering apparatus 100* includes a substrate holder assembly 102* configured to support a plurality of elongated substrates 126* (e.g., fibers, wires, etc.) for sputtering. For instance, the substrate holder assembly 102* may include a plurality of drive end holders 124* configured to vertically support "drive ends" of the substrates 126* relative to the remainder of the apparatus 100* and an idle end holder 128* configured to support the "idle ends" of the substrates relative to the remainder of the apparatus 100*, with the drive end holders 124* being supported for rotation with the substrates 126* about their respective axes S* via a drive end support bracket 127* positioned opposite the idle end holder 128*. In addition, the sputtering apparatus 100* includes a holder drive assembly 104* configured to rotate the substrate holder assembly 102* (and the substrates 126* supported thereby) about a holder rotational axis (e.g., axis H*). Similar to the embodiment described above, the holder drive assembly 104* may include, for example, a rotational drive source 108* (e.g., a motor) coupled to a driveshaft 106* (e.g., via a coupler 105*) and an intermediate shaft 117* coupled to the driveshaft 106* for rotation therewith about the holder axis H*, with the intermediate shaft 117* being coupled at its opposed ends to the drive end support bracket 127* and the idle end holder 128* to support the substrates 126* for rotation about the holder axis H*.

Additionally, the sputtering apparatus 100* includes a substrate drive assembly 110* that is configured to rotate each supported substrate 126 about its respective substrate axis S* simultaneously with such substrates 126* being rotated about the holder axis H* via the holder drive assembly 104*. Similar to the embodiment described above, the substrate drive assembly 110* includes a substrate transmission 120* including a plurality of meshing substrate gears 122*, with each substrate gear 122* being coupled to a respective drive end holder 124* for rotation about the associated substrate axis S. However, unlike the embodiment described above in which the substrate transmission 120 was rotationally driven via a common drive source 108 (i.e., the motor of the holder drive assembly 104), the substrate drive assembly 110* shown in FIG. 5 includes a separate drive source 500 (e.g., motor) that is configured to rotationally drive the substrate transmission 120*. For instance, the drive source 500 may be coupled to one of the substrate gears 122* (e.g., the centrally located gear) via a drive shaft 502 or similar means to allow the drive source 500 to rotationally drive the entire substrate transmission 120* (i.e., via the meshing substrate gears 122*). Such an independent drive source may allow the substrates 126 to be rotated at different or varying speeds about one axis H*, S* without impacting the rotational speed of the substrates 126 about the other axis.

Figure 6:
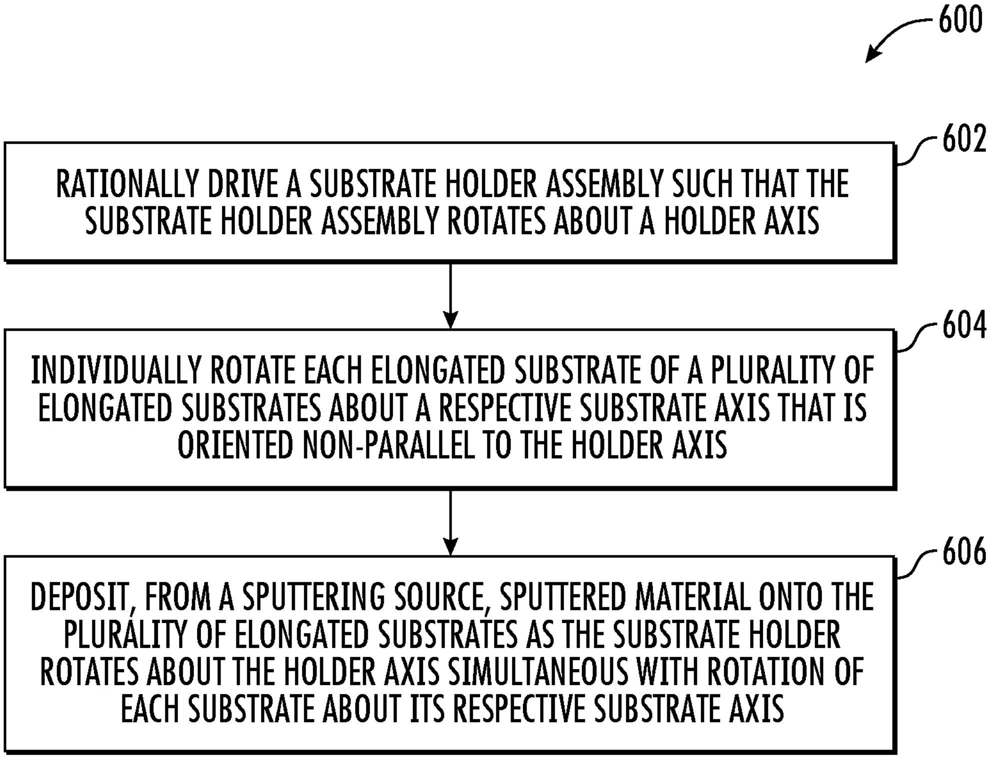
FIG. 6 illustrates a flow chart of one embodiment of a method of sputtering elongated substrates supported by a sputtering apparatus in accordance with aspects of the present subject matter.

Referring now to FIG. 6, a flow diagram of one embodiment of a method 600 of sputtering substrates is illustrated in accordance with aspects of the present subject matter. In general, the method 600 will be described herein with reference to the embodiments of the sputtering apparatus 100 and 100* and related systems 20, 20* described above with reference to FIGS. 1-5. However, it should be appreciated by those of ordinary skill in the art that the disclosed method 600 may generally be utilized in association with apparatuses and systems having any other suitable configuration. In addition, although FIG. 6 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

As shown in FIG. 6, at (602), method 600 may generally include rotationally driving a substrate holder assembly supporting a plurality of elongated substrates such that the substrate holder rotates about a holder axis. For instance, as indicated above, sputtering apparatus 100, 100* may include a substrate holder assembly 102, 102* configured to support a plurality of elongated substrates 126, 126* relative to a sputtering source, with the holder assembly 102, 102* (and the substrates 126, 126* supported thereby) being configured to be rotated about a holder axis H, H* via an associated holder drive assembly 104, 104*.

Additionally, at (604), method 600 may generally include individually rotating each elongated substrate about a respective substrate axis that is oriented non-parallel to the holder axis. For instance, as indicated above, sputtering apparatus 100, 100* may include a substrate drive assembly 110, 110*configured to individually rotate each elongated substrate 126, 126* about a respective substrate axis S, S* oriented non-parallel to the holder axis H, H*.

Moreover, at (606), method 600 may generally include depositing, from the sputtering source, sputtered material onto the plurality of elongated substrates as the substrate holder is rotated about the holder rotational axis simultaneous with rotation of each substrate about its respective substrate axis. As described above, the simultaneous rotation of the substrates 126, 126* about the separate axes may allow for an even, thin film of sputtered material to be deposited thereon during the performance of a sputtering operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims or if they include equivalent structural elements with insubstantial differences from the literal language of the claims.

What is claimed is:

1. A sputtering system, comprising:

a sputtering source; and a sputtering apparatus, comprising:

a substrate holder assembly configured to support a plurality of elongated substrates relative to the sputtering source, each elongated substrate of the plurality of elongated substrates extending along a respective substrate axis;

a holder drive assembly configured to rotate the substrate holder assembly about a holder axis;

a substrate drive assembly comprising a substrate transmission operatively coupled between a drive source and the plurality of elongated substrates such that the substate transmission is configured to individually rotate each elongated substrate about the respective substrate axis for said elongated substrate, each respective substrate axis oriented perpendicular to the holder axis, wherein sputtered material is configured to be deposited onto the plurality of elongated substrates as the substrate holder assembly is being rotated about the holder axis simultaneous with rotation of each elongated substrate about the respective substrate axis for said elongated substrate, wherein the drive source comprises a common drive source with the holder drive assembly, wherein the holder drive assembly comprises a drive shaft coupled to the drive source and an intermediate shaft coupled to the drive shaft for rotation therewith about the holder axis, the substrate drive assembly including a gear-based transmission coupled between the intermediate shaft and the substrate transmission, and wherein the gear-based transmission comprises at least one intermediate gear supported by the intermediate shaft and a fixed ring gear configured to mesh with the at least one intermediate gear as the intermediate shaft and the at least one intermediate gear rotate together about the holder axis.

2. The sputtering system of claim 1, wherein meshing of the at least one intermediate gear and the fixed ring gear results in rotation of the at least one intermediate gear relative to the intermediate shaft about an axis and wherein the at least one intermediate gear is coupled to the substrate transmission such that rotation of the at least one intermediate gear about the axis results in each elongated substrate being rotated about the respective substrate axis for said elongated substrate.

3. The sputtering system of claim 1, wherein the substrate transmission comprises a plurality of meshing substrate gears, each substrate gear of the plurality of substrate gears being coupled to a respective elongated substrate to allow said respective elongated substrate to be rotated about the respective substrate axis for said respective elongated substrate, the at least one intermediate gear being coupled to one of the plurality of substrate gears to rotationally drive the substrate transmission.

* * * * *